(12) United States Patent
Terano et al.

(10) Patent No.: US 9,530,858 B2
(45) Date of Patent: Dec. 27, 2016

(54) NITRIDE SEMICONDUCTOR DEVICE AND METHOD OF MANUFACTURING THE SAME

(71) Applicant: Sumitomo Chemical Company, Limited, Chuo-ku, Tokyo (JP)

(72) Inventors: Akihisa Terano, Tokyo (JP); Tomonobu Tsuchiya, Tokyo (JP); Naoki Kaneda, Tsuchiura (JP); Tomoyoshi Mishima, Shiki (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 0 days.

(21) Appl. No.: 14/582,468

(22) Filed: Dec. 24, 2014

(65) Prior Publication Data

US 2015/0179780 A1 Jun. 25, 2015

(30) Foreign Application Priority Data

Dec. 25, 2013 (JP) ................. 2013-267517

(51) Int. Cl.
| | |
|---|---|
| *H01L 29/15* | (2006.01) |
| *H01L 31/0256* | (2006.01) |
| *H01L 29/66* | (2006.01) |
| *H01L 29/20* | (2006.01) |
| *H01L 29/732* | (2006.01) |
| *H01L 29/737* | (2006.01) |
| *H01L 29/08* | (2006.01) |

(52) U.S. Cl.
CPC ..... *H01L 29/66242* (2013.01); *H01L 29/0817* (2013.01); *H01L 29/0821* (2013.01); *H01L 29/2003* (2013.01); *H01L 29/66318* (2013.01); *H01L 29/732* (2013.01); *H01L 29/7371* (2013.01)

(58) Field of Classification Search
CPC .................. H01L 21/02458; H01L 21/0254
USPC ................... 257/76, 197; 438/312
See application file for complete search history.

(56) References Cited

U.S. PATENT DOCUMENTS

| | | | | |
|---|---|---|---|---|
| 4,146,905 | A * | 3/1979 | Appels | H01L 21/00 257/525 |
| 5,763,921 | A * | 6/1998 | Okumura | H01L 27/0928 257/371 |
| 6,411,133 | B1 * | 6/2002 | Matsudai | H03K 5/2481 327/427 |
| 7,622,788 | B2 * | 11/2009 | Hsin | H01L 29/66318 257/565 |
| 8,410,549 | B2 * | 4/2013 | Bulucea | H01L 21/26513 257/336 |

(Continued)

FOREIGN PATENT DOCUMENTS

JP 2003-59938 A 2/2003

*Primary Examiner* — Jami M Valentine
(74) *Attorney, Agent, or Firm* — Crowell & Moring LLP

(57) ABSTRACT

Disclosed are an npn-type bipolar transistor as a nitride semiconductor device having good characteristics, and a method of manufacturing the same. A so-called pn epitaxial substrate has a structure wherein an n-type collector layer and a p-type base layer of a three-layer structure are provided over a substrate. The three-layer structure includes first (lower layer side), second, and third (upper layer side) p-type base layers which differ in thickness and p-type impurity concentration. In a partial region inside the second p-type base layer located as an intermediate layer in the p-type base layer of the three-layer structure, an n-type emitter region is formed by ion implantation.

16 Claims, 8 Drawing Sheets

(56) References Cited

U.S. PATENT DOCUMENTS

| | | | |
|---|---|---|---|
| 2002/0056877 A1* | 5/2002 | Liu | H01L 29/7393 257/355 |
| 2002/0195619 A1 | 12/2002 | Makimoto et al. | |
| 2009/0303371 A1* | 12/2009 | Watanabe | H01L 27/14603 348/311 |
| 2010/0237457 A1* | 9/2010 | Kitagawa | H01L 29/0634 257/487 |
| 2011/0012129 A1* | 1/2011 | Zhang | H01L 21/8213 257/77 |
| 2012/0012898 A1* | 1/2012 | Iwamoto | H01L 27/14812 257/222 |
| 2013/0062622 A1* | 3/2013 | Tsuchiya | H01L 29/7394 257/77 |
| 2014/0042462 A1* | 2/2014 | Tsuchiya | H01L 29/7394 257/77 |
| 2014/0210003 A1* | 7/2014 | Ko | H01L 27/0629 257/337 |

\* cited by examiner

NITRIDE SEMICONDUCTOR DEVICE AND METHOD OF MANUFACTURING THE SAME

CLAIM OF PRIORITY

The present application claims priority from Japanese application serial no. JP2013-267517, filed on Dec. 25, 2013, the content of which is hereby incorporated by reference into this application.

BACKGROUND OF THE INVENTION

1. Field of the Invention

The present invention relates to a nitride semiconductor device and a method of manufacturing the same. More particularly, the invention relates to a bipolar transistor including an npn-type nitride semiconductor and a method of manufacturing the same.

2. Description of the Related Art

A heterojunction bipolar transistor (hereinafter abbreviated as HBT) disclosed, for example, in JP-2003-59938-A is known as a bipolar transistor using a nitride semiconductor.

In fabricating the HBT described in JP-2003-59938-A, an epitaxial substrate of a double hetero structure is prepared. The epitaxial substrate is produced by a method wherein a Si-doped n-type GaN sub-collector layer, a Si-doped n-type GaN collector layer, a Si-doped n-type InGaN graded layer, a Mg-doped p-type InGaN base layer, and a Si-doped n-type GaN emitter layer are sequentially (from lower side toward upper side) grown over a SiC substrate, with a AlN buffer layer interposed therebetween. Of the epitaxial substrate, a p-type InGaN base surface and an n-type GaN sub-collector surface are exposed in desired shapes by dry etching. Thereafter, an emitter electrode, a base electrode, and a collector electrode are provided respectively on the relevant layers of the epitaxial substrate, to configure the desired HBT. The n-type InGaN graded layer, which has a high impurity concentration and in which the band gap is varied gradually, is thus provided between the collector layer and the base layer. It is described in the document that this structure enables electrons or positive holes to smoothly travel in a direction orthogonal to the hetero interface, leading to an enhanced current gain.

SUMMARY OF THE INVENTION

The nitride semiconductor immediately after the nitride semiconductor doped with Mg (which is a p-type impurity) is grown by an MOVPE (metal organic vapor phase epitaxy) method has the carrier in an inactive state due to the influence of H (hydrogen) mixed in together with Mg and bonded to Mg. This results in that the resistance of the semiconductor itself is very high.

Commonly, therefore, a high-temperature annealing in a gas atmosphere such as $N_2$ (nitrogen) is conducted, with the semiconductor surface exposed, after the epitaxial growth so as to liberate the Mg-bonded hydrogen from inside the semiconductor and thereby to activate the carrier (this annealing will hereinafter be referred to simply as Mg activation anneal). The annealing temperature in this case has been reported to be normally in the range from 500 to 900° C.

In the case where a Si-doped nitride semiconductor is grown stackedly on the Mg-doped nitride semiconductor, however, even if the Mg activation anneal is carried out the liberation of H is hampered due to the influence of Si (which is an n-type impurity) contained in the upper layer. This makes it difficult to activate the carrier in the Mg-doped nitride semiconductor.

The HBT disclosed in JP-2003-59938-A is fabricated by a method wherein an epitaxial substrate having undergone the growth of layers ranging up to the Si-doped n-type GaN emitter layer (which is the uppermost layer) is used, the desired areas of the p-type base surface and n-type collector surface are exposed by dry etching, and ohmic electrodes are formed respectively on the relevant layers.

For the p-type base layer, InGaN is used which is known to be higher than GaN in Mg carrier activation factor. Since the Si-doped layer is grown stackedly on the upper side of the Mg-doped InGaN base layer, however, even if the Mg activation anneal is conducted it is difficult to activate the carrier in the Mg-doped InGaN base layer, for the reason mentioned above.

In addition, where the Mg activation anneal is carried out after the p-type base layer surface is exposed by dry etching, the carrier in the p-type InGaN base layer thus exposed (external base region) is activated.

However, the p-type InGaN base layer directly beneath the n-type emitter region which has been patterned (intrinsic base region) tends to have a raised base resistance because it is difficult to activate the carrier, in the same way as above.

Furthermore, the surface of the Mg-doped p-type nitride semiconductor exposed by dry etching is heavily damaged under the influence of exposure to plasma during the etching. The influence of the damage may cause deterioration to such an extent that the surface region comes to show n-type conductivity instead of p-type conductivity. Consequently, it would be difficult to obtain good ohmic contact of the base layer with the base electrode.

Due to the aforementioned problems concerned with the p-type nitride semiconductor, it is difficult, by the structures and manufacturing methods according to the related art, to provide a nitride semiconductor bipolar transistor having good transistor characteristics.

The present invention has been made in consideration of the foregoing. Accordingly, it is an object of the present invention to provide a nitride semiconductor bipolar transistor having good transistor characteristics, and a method of manufacturing the same.

According to an aspect of the present invention, there is provided a nitride semiconductor device including: a substrate; a first n-type nitride semiconductor layer formed over the substrate; a first p-type nitride semiconductor layer having a first p-type impurity concentration, the first p-type nitride semiconductor layer formed in a desired region over the first n-type nitride semiconductor layer; a second p-type nitride semiconductor layer having a second p-type impurity concentration, the second p-type nitride semiconductor layer formed over the first p-type nitride semiconductor layer; a third p-type nitride semiconductor layer having a third p-type impurity concentration, the third p-type nitride semiconductor layer formed in a partial region over the second p-type nitride semiconductor layer; a region including a second n-type nitride semiconductor formed inside a partial region of the second p-type nitride semiconductor layer by ion implantation of an n-type impurity; a first electrode put in ohmic connection to the first n-type nitride semiconductor layer; a second electrode put in ohmic connection to a part of the third p-type nitride semiconductor layer; and a third electrode put in ohmic connection to a part of the second n-type nitride semiconductor, wherein the first p-type impurity concentration concerning impurity addition to the first p-type nitride semiconductor layer is higher than the second p-type impurity concentration concerning impurity addition to the second p-type nitride semiconductor layer, and the third p-type impurity concentration concerning impurity addition to the third p-type nitride semiconductor layer is higher than the second p-type impurity concentration concerning impurity addition to the second p-type nitride semiconductor layer.

In the nitride semiconductor device as above, preferably, a first electrode put in ohmic connection to a back side of the substrate is formed in place of the first electrode put in ohmic connection to the first n-type nitride semiconductor layer.

In the nitride semiconductor device as above, preferably, a minimum distance from an end portion of the region including the second n-type nitride semiconductor that is formed inside the partial region of the second p-type nitride semiconductor layer to the second electrode is at least longer than a distance represented by a vertical thickness from the second electrode to the first p-type nitride semiconductor layer.

According to another aspect of the present invention, there is provided a method of manufacturing a nitride semiconductor device, including: forming a first n-type nitride semiconductor layer over a substrate by epitaxial growth; sequentially forming a first p-type nitride semiconductor layer having a first p-type impurity concentration, a second p-type nitride semiconductor layer having a second p-type impurity concentration, and a third p-type nitride semiconductor layer having a third p-type impurity concentration over the first n-type nitride semiconductor layer by epitaxial growth; heat treating the substrate at a first temperature; forming the first to third p-type nitride semiconductor layers into a base mesa pattern by patterning in which photolithography is used and dry etching; subjecting the third p-type nitride semiconductor layer to dry etching to expose the second p-type nitride semiconductor layer; implanting ions of an n-type impurity into the exposed second p-type nitride semiconductor layer to form a region including a second n-type nitride semiconductor; forming a protective film over a surface of the substrate, followed by a heat treatment at a second temperature; and respectively forming a first electrode put in ohmic connection onto the first n-type nitride semiconductor layer or a back side of the substrate, a second electrode put in ohmic connection onto the third p-type nitride semiconductor layer, and a third electrode put in ohmic connection to the second n-type nitride semiconductor.

According to the above-mentioned configurations offered by some aspects of the present invention, it is possible to provide a nitride semiconductor device which can be easily fabricated by use of a substrate having a standard pn epitaxial structure, without requiring any process treatment that would cause deterioration of a p-type base layer, and which has good device characteristics, and a method of manufacturing the same.

DETAILED DESCRIPTION OF THE PREFERRED EMBODIMENTS

Figure 1:
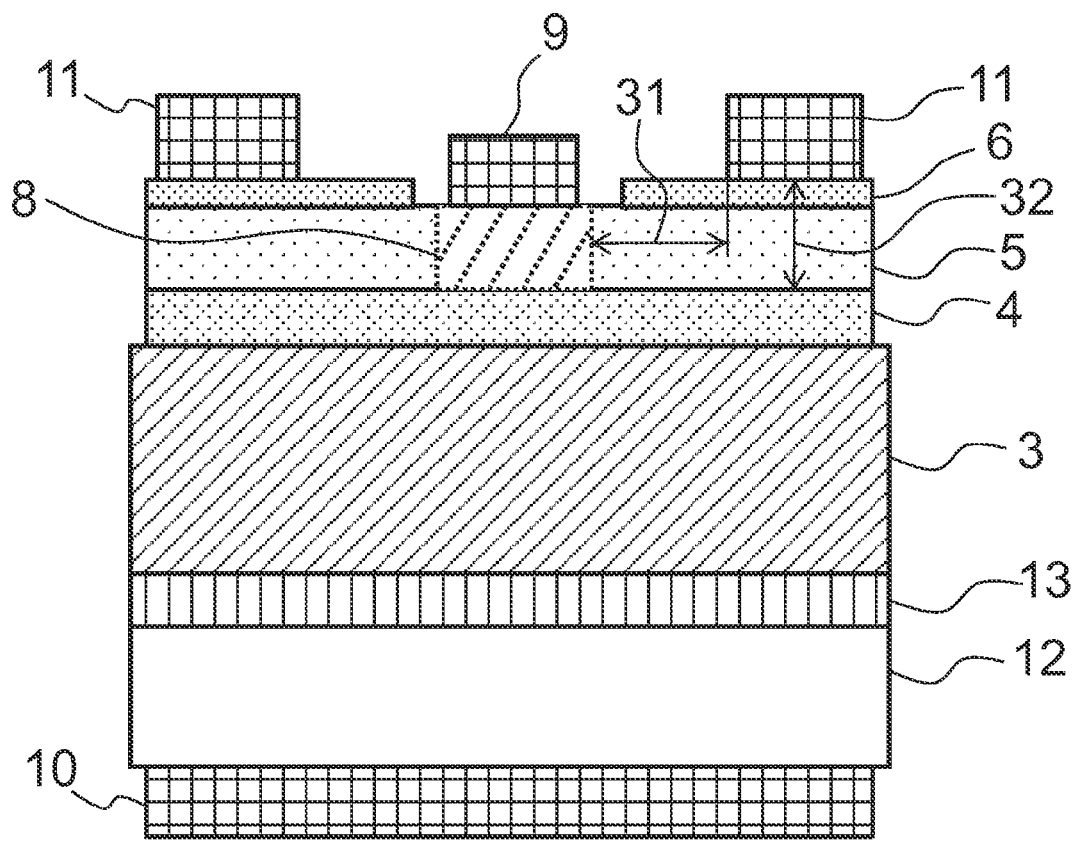
FIG. 1 is a sectional view of an npn-type homojunction bipolar transistor fabricated on a GaN substrate which is a nitride semiconductor device according to Example 2 of the present invention.

As has been described in the summary above, a Mg-doped p-type nitride semiconductor immediately upon epitaxial growth is in a state where the carrier is inactive due to the influence of H (hydrogen). Therefore, in a state where a surface of the Mg-doped p-type nitride semiconductor is exposed, first, a Mg activation anneal should be conducted in a temperature range of 500 to 900° C. so that the hydrogen (H) contained in the semiconductor is removed appropriately.

An optimum value for the Mg activation annealing temperature, that is, an annealing temperature at which the resistance of the p-type nitride semiconductor will be made the lowest, depends on the kind of the semiconductor material and the process equipment used. This may be the reason why the aforementioned temperature range was generated.

The present inventors have made investigations using equipment possessed by them. As a result, it has been found that the optimum temperature is 600° C. in the case of Mg-doped GaN and is 800° C. in the case of Mg-doped InGaN, and that a temperature lower or higher than the just-mentioned value caused the resistance of the semiconductor to tend to increase.

In addition, a p-type nitride semiconductor has the problem that the surface of the semiconductor is deteriorated under the influence of exposure to plasma during dry etching applied to the semiconductor surface, which makes it difficult to achieve favorable ohmic contact of the semiconductor with an electrode.

In view of the foregoing, the present inventors made extensive and intensive investigations on the structures of bipolar transistors that can ensure favorable activation of the carrier in a p-type nitride semiconductor while maintaining good ohmic contact of an ohmic electrode with the p-type nitride semiconductor.

As a result of the investigations, it has been inferred possible to build up a bipolar transistor if a region (corresponding to emitter) including an n-type nitride semiconductor can be formed in a part of the inside of a p-type nitride semiconductor located on the most face side, using a so-called pn epitaxial structure in which an n-type nitride semiconductor (corresponding to collector) is provided on the lower layer side and a p-type nitride semiconductor (corresponding to base) is provided on the upper layer side of the same and in a region on the most face side of an epitaxial layer.

It has been judged suitable to adopt an ion implantation method as a method for fabricating a region including an n-type nitride semiconductor and formed in a part of the inside of the p-type nitride semiconductor.

For ion implantation into a nitride semiconductor, there has been well-known, in an AlGaN/GaN HEMT structure, for example, a technique of reducing contact resistance with 2DEG by implanting Si ions into a source-drain electrode formation region.

In order to activate the carrier after implantation of ions of Si as an n-type impurity, a high-temperature annealing should be conducted at a temperature of not lower than 1,050° C., preferably at or above 1,100° C. The temperature of not lower than 1,050° C. is comparable to or not lower than the crystal growth temperature of the nitride semiconductor. If annealing is conducted with the semiconductor surface exposed, therefore, the semiconductor crystal itself is deteriorated. In view of this, in the activation anneal after the ion implantation, normally, the substrate surface is entirely protected with an insulating film.

Heretofore, however, there have not been clear reports or findings about electrical characteristics of p-type nitride semiconductors after the p-type nitride semiconductor formed thereon with a protective film is subjected to a high-temperature annealing at a temperature as high as 1,100° C.

In view of this, the present inventors produced the following experimental samples and made evaluation thereof, in order to make clear the heat resistance of p-type nitride semiconductors formed thereon with a protective film, especially, ohmic contact properties with electrodes, and the presence or absence of variations in the resistance of the semiconductor.

In the experiment, use was made of an epitaxial substrate wherein a Mg-doped p-type GaN layer (with an impurity concentration of $5 \times 10^{17}$ cm$^{-3}$ and a thickness of 3,000 nm) and a highly Mg-doped p-type GaN layer (with an impurity concentration of $2 \times 10^{20}$ cm$^{-3}$ and a thickness of 20 nm) were sequentially grown epitaxially over a sapphire substrate, with an undoped GaN buffer layer of 3,000 nm thickness interposed therebetween.

The epitaxial substrate is cleaved into desired size to prepare two samples. First, both the samples, with their surfaces exposed, are subjected to a normal Mg activation anneal (anneal conditions: 600° C., 30 minutes).

Thereafter, one of the two samples is formed on its surface with a 50 nm-thick SiN protective film, followed by an annealing treatment at 1,100° C. for 10 minutes. This annealing treatment corresponds to an activation anneal after ion implantation. After the sample is cooled, the SiN protective film having been formed on the surface is removed by immersion in concentrated HF for a long time. Thereafter, a plurality of Pd electrodes (film thickness: 200 nm) with an electrode diameter of 1 mm are formed, at regular intervals of 5 mm, on the surface of each of the two samples, to complete experimental samples.

Figure 3:
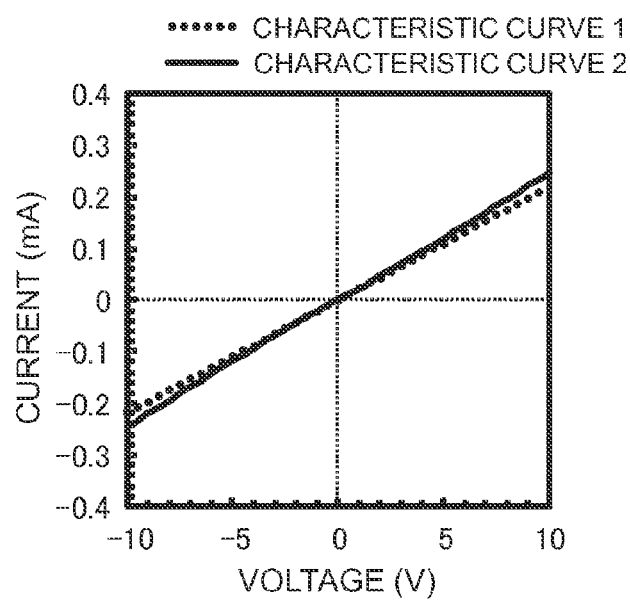
FIG. 3 is a diagram (graph) showing current (I)-voltage (V) characteristics between Pd electrodes represented by characteristic curve 1 and characteristic curve 2 obtained upon an investigation of variations in characteristics of a p-type nitride semiconductor, in which a SiN protective film is formed, due to a high-temperature annealing treatment.

The details of the annealing treatment process applied to the samples produced as above are as follows.
(1) Sample A: a normal Mg activation anneal treatment only (600° C., 30 minutes)
(2) Sample B: a normal Mg activation anneal treatment (the same as above) followed by coating with a SiN film and an anneal at 1,100° C. for 10 minutes For Sample A and Sample B, current (I)-voltage (V) characteristic between Pd electrodes was evaluated, the results being shown in FIG. 3. From this figure it is seen that the characteristic of Sample A (characteristic curve 1: broken line) corresponds to a lowest-resistance p-type GaN layer obtained upon the Mg activation anneal alone. It is also seen that the characteristic of Sample B (characteristic curve 2: solid line) in the case where a high-temperature annealing treatment at a temperature as high as 1,100° C., with the SiN protective film on the sample, is additionally conducted after the Mg activation anneal, is little different from the characteristic of Sample A. Thus, both samples have been verified to have comparable characteristics in regard of the inclination of current (which represents the resistance of semiconductor) and the linearity in the vicinity of a voltage of 0 V (which represents the acceptability of ohmic properties).

This suggests that a p-type nitride semiconductor having undergone the normal Mg activation anneal maintains the state and characteristics upon the Mg activation anneal, without any deterioration, even when the high-temperature anneal at a temperature as high as 1,100° C. is added, inasmuch as the semiconductor is in the state of being protected with the SiN protective film.

From the foregoing, the following was found out. Even when a p-type nitride semiconductor having undergone the Mg activation anneal at first is formed in a part of the inside thereof with a region including an n-type nitride semiconductor by sequentially conducting Si ion implantation, protective film formation, and carrier activation anneal, such problems as an increase in resistance or deterioration of ohmic contact with electrodes would not be generated in p-type nitride semiconductor regions other than the region of Si ion implantation. Thus, a bipolar transistor structure can be realized on the pn epitaxial substrate constructed by the present inventor. Examples of the present inventions and effects thereof will be described below, referring to the drawings.

Example 1

Figure 4:
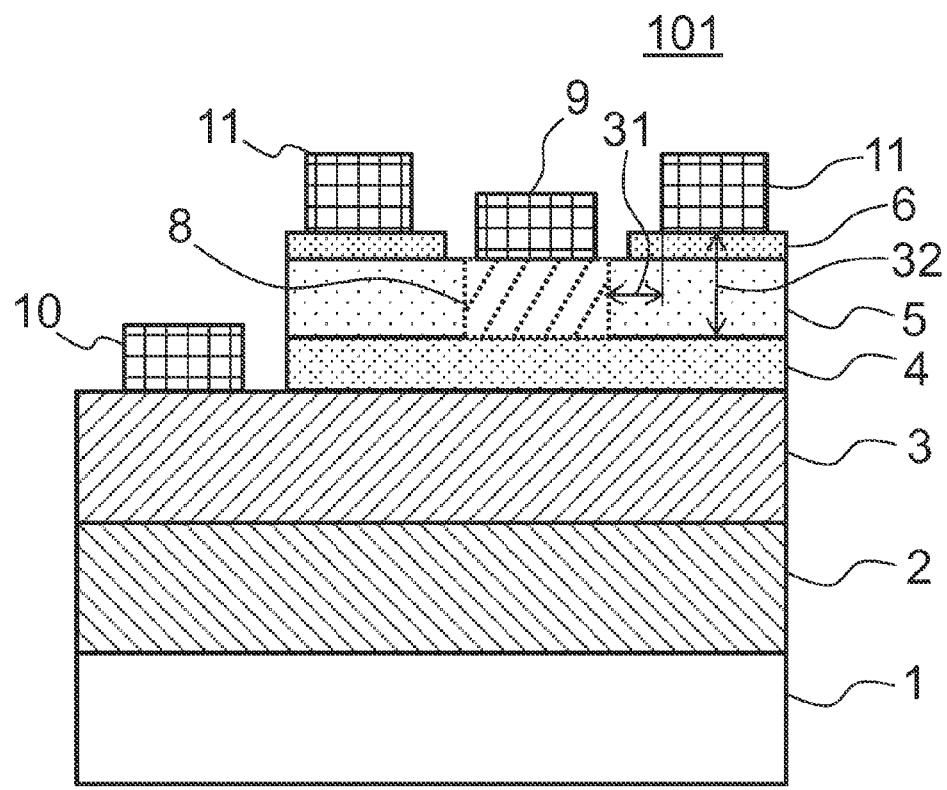
FIG. 4 is a sectional view of an npn-type homojunction bipolar transistor fabricated on a sapphire substrate which is a nitride semiconductor device according to Example 1 of the present invention.

Now, an embodiment of a nitride semiconductor device as Example 1 of the present invention will be described below. FIG. 4 is a sectional view of an npn-type homojunction bipolar transistor fabricated on a sapphire substrate as a nitride semiconductor device according to this Example.

FIGS. 5A to 5F are views illustrating, process step by process step, a method of manufacturing the nitride semiconductor device shown in FIG. 4.

Referring to FIGS. 5A to 5F, first, description will be made of the method of manufacturing the nitride semiconductor device according to Example 1 of the present invention.

Figure 5A:
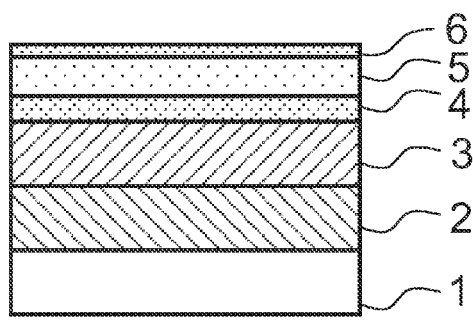
FIGS. 5A to 5F are views for illustrating a method of manufacturing a nitride semiconductor device according to Example 1 of the present invention.

As depicted in FIG. 5A, first, five layers are sequentially formed over a sapphire substrate 1 by an MOVPE method, the five layers being: a buffer layer 2 including undoped GaN and having a thickness of 2,000 nm; an n-type collector layer 3 including n-type GaN and having a Si impurity concentration (hereinafter referred to simply as Si concentration) of $5 \times 10^{17}$ cm$^{-3}$ and a thickness of 2,000 nm; a first p-type base layer 4 including p-type GaN and having a Mg impurity concentration (hereinafter referred to simply as Mg concentration) of $1 \times 10^{19}$ cm$^{-3}$ and a thickness of 100 nm; a second p-type base layer 5 including p-type GaN and having a Mg concentration of $1 \times 10^{18}$ cm$^{-3}$ and a thickness of 500 nm; and a third p-type base layer including p-type GaN and having a Mg concentration of $2 \times 10^{20}$ cm$^{-3}$ and a thickness of 20 nm. Thereafter, a Mg activation anneal (N$_2$ atmosphere, 600° C., 30 minutes) for the first to third p-type base layers 4, 5, and 6 is conducted using an ordinary heat treatment furnace.

Figure 5D:
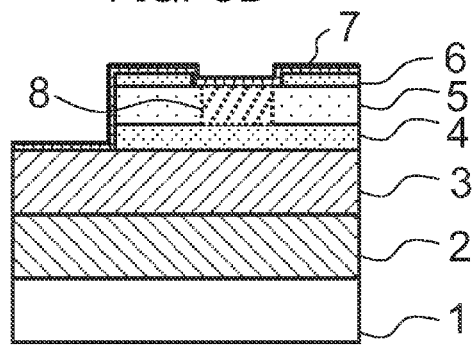
Figure 5B:
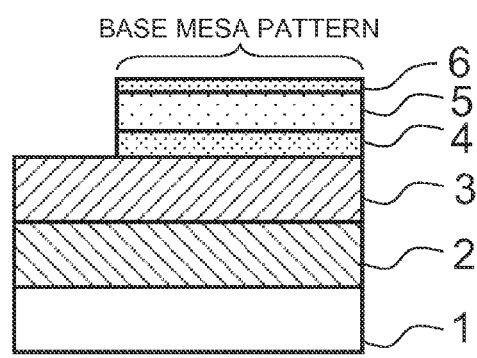

As shown in FIG. 5B, a base mesa pattern including SiO$_2$ is formed by patterning conducted using photolithography. Using the base mesa pattern as a mask, dry etching in chlorine gas is conducted to etch the exposed first to third p-type base layers 4, 5, and 6, thereby exposing a surface of the n-type collector layer 3 and forming a base mesa pattern.

Figure 5E:
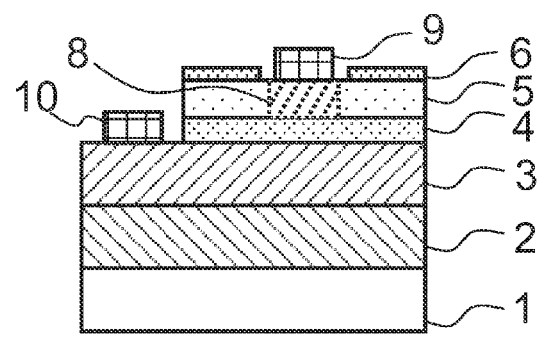
Figure 5C:
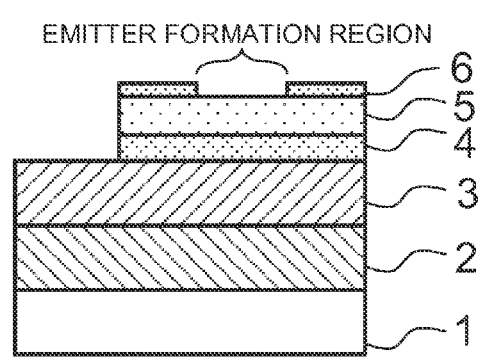

As shown in FIG. 5C, a photoresist pattern with an opening corresponding to an emitter formation region in the base mesa pattern composed of the first to third p-type base layers 4, 5, and 6 is formed, and, thereafter, the third p-type base layer 6 exposed in the opening region is dry etched in the same manner as above, to expose the second p-type base layer 5 beneath it.

As shown in FIG. 5D, a photoresist pattern with an opening corresponding to a region on the inner side than the region where the second p-type base layer 5 is exposed is formed, and, thereafter, Si ion implantation is applied from the substrate face side, whereby Si ions are implanted into the second p-type base layer 5 located in the opening region. As implantation conditions, two acceleration voltages of 600 keV and 150 keV are adopted, and the implantation amount is set at $2 \times 10^{15}$ cm$^{-2}$ in total. After removal of unrequired photoresist, a SiN protective film 7 in a thickness of 50 nm is formed to coat the whole substrate surface. Thereafter, an activation anneal treatment at 1,100° C. is conducted in a N$_2$ atmosphere for 10 minutes, whereby an n-type emitter region 8 is formed inside the second p-type base layer 5.

As shown in FIG. 5E, after removal of unrequired SiN film 7, an emitter electrode opening pattern and a collector electrode opening pattern which are composed of multilayer resists with openings corresponding respectively to a desired region in the n-type emitter region 8 and to a desired region on the n-type collector layer 3 are formed by a known photolithography technique, and, thereafter, a Ti/Al stacked film is formed to coat the whole substrate surface by an electron beam evaporation method. Subsequently, unrequired metal film and photoresist are removed by use of a lift-off method, whereby an emitter electrode pattern 9 and a collector electrode pattern 10 composed of the Ti/Al stacked film are formed. Thereafter, the substrate thus formed with the electrode patterns is heat treated in a N$_2$ atmosphere at 500° C. for 10 minutes, to form an emitter electrode 9 and a collector electrode 10 which show good ohmic characteristics to the layers.

Figure 5F:
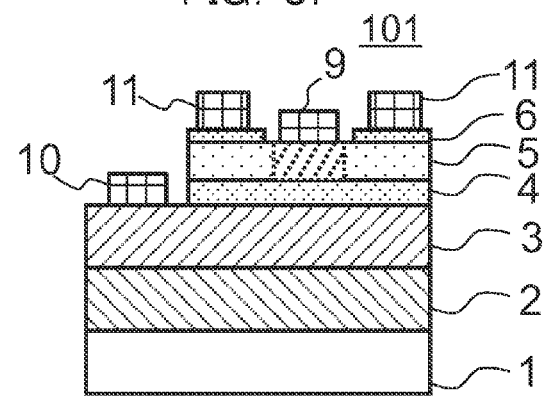

As shown in FIG. 5F, a base electrode opening pattern composed of a multilayer photoresist with an opening corresponding to a desired region on the third p-type base layer 6 is formed by a known photolithography technique, and, thereafter, a Pd/Ti/Au stacked film is formed by an electron beam evaporation method. Subsequently, unrequired metal film and photoresist are removed by a lift-off method, to form a base electrode 11 composed of the Pd/Ti/Au stacked film and showing good ohmic characteristics to the first to third p-type base layers 4, 5, and 6. In this way, an npn-type homojunction bipolar transistor 101 fabricated on the sapphire substrate as shown in FIG. 4, which is one embodiment of the nitride semiconductor device pertaining to the present invention, is completed.

Figure 6:
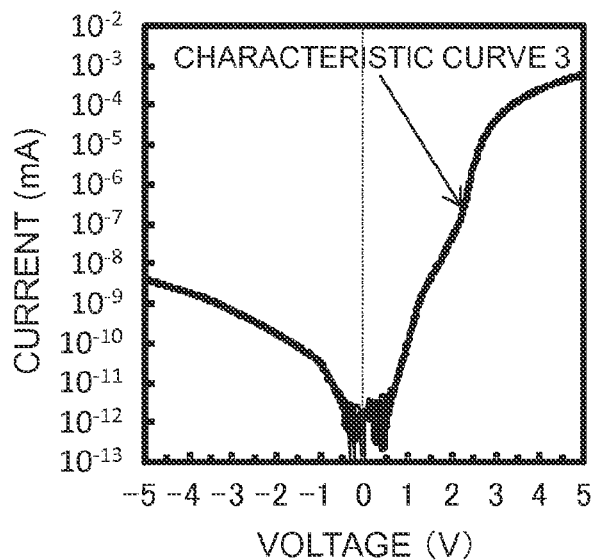
FIG. 6 is a diagram (graph) showing evaluation results of forward-reverse characteristics between an n-type emitter region and a p-type base layer represented by characteristic curve 3, of the npn-type homojunction bipolar transistor fabricated on the sapphire substrate which is a nitride semiconductor device according to Example 1 of the present invention.
Figure 7:
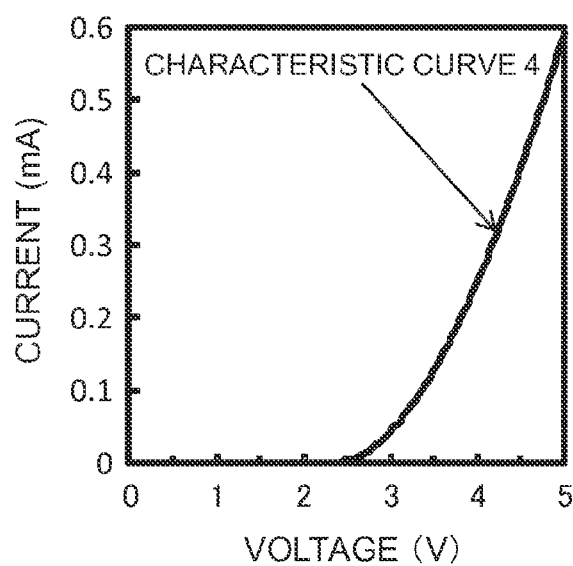
FIG. 7 is a diagram (graph) showing evaluation results of forward characteristics between an n-type emitter region and a p-type base layer represented by characteristic curve 4, of the npn-type homojunction bipolar transistor fabricated on a sapphire substrate which is a nitride semiconductor device according to Example 1 of the present invention.

For the bipolar transistor of the above structure, diode characteristic between the n-type emitter region formed by Si ion implantation and the p-type base layer was evaluated, the results being shown in FIGS. 6 and 7. FIG. 6 is a graph formed by semilogarithmic plotting of forward/reverse characteristics with an impressed voltage varied between −5 V to +5 V. FIG. 7 is a graph formed by linear plotting of only forward characteristic of diode. Note that the emitter electrode of the device put to evaluation measures 100 μm by 100 μm.

According to a forward/reverse I-V characteristic represented by characteristic curve 3, the current value at +5 V is about $6 \times 10^{-4}$ A, whereas the current value at −5 V is $4 \times 10^{-9}$ A. Thus, a rectification characteristic of not less than 5 orders of magnitude in terms of ratio of forward current to reverse current is exhibited. Furthermore, from a forward I-V characteristic represented by characteristic curve 4 in FIG. 7, it has been clearly found that the current rising voltage is at around 3 V, which is a standard value in pn junction characteristics of nitride semiconductors.

Accordingly, it is seen that the junction between the n-type emitter region formed inside the second p-type base layer by Si ion implantation and each of the first to third p-type base layers is a pn junction, which is indispensable for realization of a bipolar transistor.

Besides, it has been made clear from the above evaluation results that a desired n-type conductivity was obtained, although the n-type emitter region is a region in which Mg as a p-type impurity and Si as an n-type impurity are mixedly present.

Figure 8:
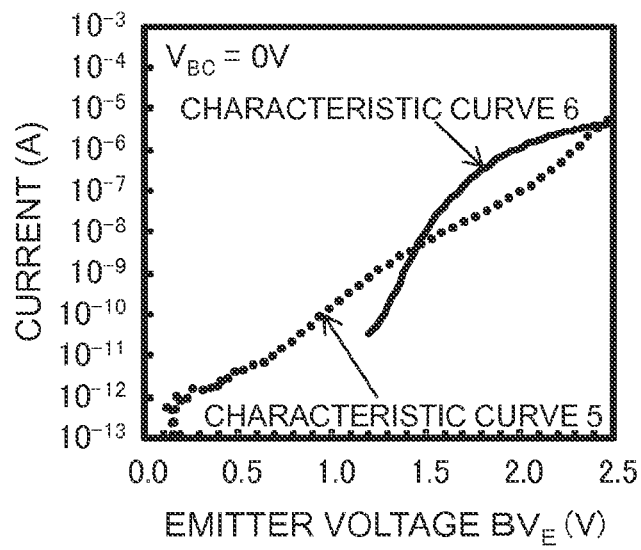
FIG. 8 is a diagram (graph) showing the results of Gummel plot represented by characteristic curves 5 and 6, of the npn-type homojunction bipolar transistor fabricated on a sapphire substrate which is a nitride semiconductor device according to Example 1 of the present invention.
Figure 9:
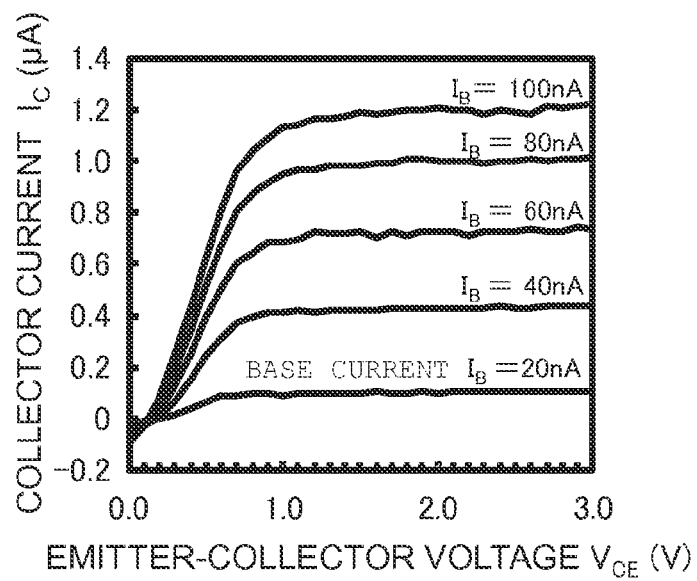
FIG. 9 is a diagram (graph) showing evaluation results of static characteristic ($I_C$-$V_{CE}$ characteristic) of the npn-type homojunction bipolar transistor fabricated on a sapphire substrate which is a nitride semiconductor device according to Example 1 of the present invention.

In the next place, evaluation results of transistor characteristics of the device are shown in FIGS. 8 and 9. FIG. 8 shows Gummel plots. The Gummel plot is a plot of variations in base current $I_B$ and collector current $I_C$ when a base-collector voltage $V_{BC}$ in emitter grounding is fixed at 0 V and a reverse voltage $BV_E$ is impressed on the emitter. On one hand, the base current $I_B$ represented by characteristic curve 5 in the figure increased. On the other hand, the collector current $I_C$ represented by characteristic curve 6 started increasing from the point of an emitter voltage $BV_E$ of 1.2 V. Further, $I_C$ was greater than $I_B$ at the time when the voltage is not less than 1.5 V. In other words, it is shown that a DC (direct current) amplification factor $h_{FE}$ of not less than 1 (one) was obtained. Furthermore, a maximum $h_{FE}$ value of 13 was obtained when $BV_E$ was 1.9 V.

Note that although the value of $I_C$ was lower than the value of $I_B$ when $BV_E$ is set to be not less than 2.4 V, this is attributable to a structural problem of the device fabricated experimentally. Specifically, the distance from a base mesa end portion to the collector electrode was as large as 30 μm, against the thickness (2,000 nm) of the n-type collector layer. Under the influence of this large distance, the collector resistance was raised, which is the reason why $I_C$ was lower than $I_B$ at a $BV_E$ of 2.4V or above.

In a bipolar transistor fabricated on an n-type GaN substrate which will be described later in Example 2, a collector electrode can be formed over a wide area on the back side of the n-type GaN substrate. In that case, therefore, the problem with the collector resistance can be avoided.

FIG. 9 shows evaluation results of static characteristics of the device. As shown in the figure, the offset voltage was as low as 0.2 V or below, and the collector current $I_C$ also increased normally according to a variation in the base current $I_B$. The good characteristics thus obtained show that when the structure and the manufacturing method according to this Example are applied, a bipolar transistor having good characteristics can be realized using a pn epitaxial substrate of a standard structure.

Note that a characteristic structure of the nitride semiconductor device according to the present invention resides in that the p-type nitride semiconductor layer provided as a base layer has a three-layer structure composed of three layers which differ in thickness and in Mg concentration (p-type impurity concentration).

The first p-type nitride semiconductor layer (first p-type base layer) formed on the n-type collector layer includes an intrinsic base region located beneath the n-type emitter region, which is important for realization of normal transistor operations. Therefore, the resistance of the semiconductor itself should be lowered as much as possible.

Accordingly, it is preferable for the impurity concentration in the first p-type nitride semiconductor layer to be set to a value such that the resistance of the semiconductor layer itself will be most lowered after the Mg activation anneal.

A specific value of the p-type impurity concentration is preferably not less than $1 \times 10^{18}$ cm$^{-3}$ and not more than $4 \times 10^{19}$ cm$^{-3}$, more preferably not less than $3 \times 10^{18}$ cm$^{-3}$ and not more than $2 \times 10^{19}$ cm$^{-3}$.

In addition, for the n-type emitter region 8 formed by Si ion implantation, implantation conditions are so set that Si concentration will be high in the second p-type nitride semiconductor layer 5 mainly. As far as the ion implantation method is employed, there is a possibility that the Si impurity might reach, although in a low concentration, the first p-type nitride semiconductor layer 4 situated on the lower layer side of the second p-type nitride semiconductor layer 5.

It is preferable for the thickness of the intrinsic base region to be as small as possible, for easier realization of a high current gain. If the intrinsic base region is too thin, however, there is a risk, depending on ion implantation conditions, that an upper portion of the first p-type nitride semiconductor layer 4 might be turned into n-type under the influence of the Si impurity. When this occurs, the thickness of the intrinsic base region on an effective basis is reduced, leading to a raised possibility of deterioration of withstanding voltage characteristic.

Upon an SIMS (secondary ion mass spectrometry) analysis of the bipolar transistor fabricated in Example 1 of the present invention, the analytical results showed that the Si impurity introduced by ion implantation reached, although in a low concentration of $1 \times 10^{16}$ cm$^{-3}$ or below, an upper portion of the first p-type base layer 4 with the result of a steep lowering in Si concentration in the depth direction. Further, possibly under the influence of the ion implantation, diffusion of Mg to the side of the n-type collector layer in a concentration of $1 \times 10^{16}$ cm$^{-3}$ or below was observed.

As aforementioned, however, normal transistor characteristics were obtained successfully. This shows that even if the Si impurity reaches an upper portion of the first p-type base layer 4 and Mg inside the base layer diffuses to the side of the collector layer beneath it, such a situation would not affect the operation of the transistor, so long as the impurity concentrations of Si and Mg are low and the first p-type base layer 4 is provided in an appropriate thickness.

Accordingly, though depending on the ion implantation conditions and the impurity concentration in the first p-type nitride semiconductor, it is preferable that the thickness of the first p-type nitride semiconductor layer is at least 50 nm. More preferably, the thickness value is 80 nm at the lowest.

If the thickness of the intrinsic base region located beneath the emitter region is too large, on the contrary, it becomes difficult to obtain a current gain. In the structure according to the present invention that is obtained by application of the Si ion implantation method, it is preferable that the thickness of the first p-type nitride semiconductor layer is at most 300 nm. More preferably, the thickness value is 200 nm at the highest.

The third p-type nitride semiconductor layer (third p-type base layer) to be formed with the base electrode thereon is an important layer for establishing good ohmic contact with the base electrode. Therefore, it is preferable for this layer to have as high an impurity concentration as possible and have a small thickness. Specifically, the impurity concentration is at least $1 \times 10^{20}$ cm$^{-3}$. More preferably, the impurity concentration is at least $2 \times 10^2$ cm$^{-3}$ in the most face-side surface region.

Where the p-type impurity is added in the concentration of not less than $1 \times 10^{20}$ cm$^{-3}$, on the other hand, an increase in the thickness of the layer deteriorates crystallinity conspicuously and raises resistance, thereby deteriorating the ohmic contact with the electrode, on the contrary. Therefore, it is preferable that the film thickness is 30 nm at the very most.

Besides, in the case of crystal growth of a nitride semiconductor by addition of Mg as a usual p-type impurity, the addition of the impurity to the layer being grown is slightly delayed at the beginning stage of growth. If the film thickness is too small, therefore, the crystal growth finishes without a high impurity concentration obtained.

Therefore, it is preferable that the thickness of the third p-type nitride semiconductor layer is at least 5 nm.

The second p-type nitride semiconductor layer 5 (second p-type base layer) as an intermediate layer between the first p-type nitride semiconductor layer and the third p-type nitride semiconductor layer is an electrical interlinking layer for the upper and lower layers. Therefore, it suffices for the second p-type nitride semiconductor layer 5 to be at least a layer of p-type conductivity.

In addition, in a partial region of this layer, an n-type region with a comparatively high carrier density is provided by ion implantation. In order to mitigate as possible the influence of compensation for the ion-implanted n-type impurity by the p-type impurity, it is preferable to set the p-type impurity concentration as low as possible.

Specifically, the p-type impurity concentration is preferably at least $1 \times 10^{17}$ cm$^{-3}$ and at most $5 \times 10^{18}$ cm$^{-3}$. Desirably, the impurity concentration is in the range of from $5 \times 10^{17}$ cm$^{-3}$ to $2 \times 10^{18}$ cm$^{-3}$. The reason why the lower limit for the impurity concentration is $1 \times 10^{17}$ cm$^{-3}$ resides in the finding upon the present inventors' investigation that an impurity concentration lower than this value leads to too high a resistance, and, besides, sometimes leads to failure in obtaining p-type conductivity, which may be attributable to the influence of other impurities contained in the semiconductor in low concentrations.

The thickness of the second p-type nitride semiconductor layer is not particularly limited, since it should also be set in good balance with the acceleration voltage in Si ion implantation and the implantation amount. If the thickness is too large, however, the vertical distance from the base electrode to the first p-type nitride semiconductor layer would be longer, and the resistance component in an external base region would increase accordingly. Therefore, an extremely large thickness is undesirable. Furthermore, since there is a limit to the acceleration voltage in ion implantation, too large a thickness makes it difficult to turn the p-type nitride semiconductor into n-type in a region down to a desired depth.

If the thickness is extremely small, on the other hand, a depletion layer extending from the emitter-base junction region would immediately reach the emitter electrode, possibly lowering the withstanding voltage characteristic. Though depending also on the donor density in the n-type emitter region, accordingly, the thickness of the second p-type nitride semiconductor layer is desirably at most 800 nm and at least 300 nm.

As aforementioned, in the p-type nitride semiconductor composed of the three layers as a characteristic feature of this Example, it is important, for achieving the object of the present invention, that the p-type impurity concentration in the first p-type nitride semiconductor is higher than the p-type impurity concentration in the second p-type nitride semiconductor and that the p-type impurity concentration in the third p-type nitride semiconductor is higher than the p-type impurity concentration in the second p-type nitride semiconductor.

Example 2

Now, another embodiment of the nitride semiconductor device according to Example 2 of the present invention will be described below. FIG. 1 is a sectional view of an npn-type homojunction bipolar transistor fabricated on an n-type GaN substrate as a nitride semiconductor device according to this Example, and FIGS. 2A to 2G are sectional views used for explaining, process step by process step, a method of manufacturing the nitride semiconductor device depicted in FIG. 1. In this Example, an n-type GaN substrate is used as a substrate, so that a collector electrode can be formed over a wide area on a back side of the n-type GaN substrate. Accordingly, there is no possibility of the problem of an increase in collector resistance, such as described in Example 1 above.

Referring to FIGS. 2A to 2G, a method of manufacturing the nitride semiconductor device of Example 1 of the present invention will now be described.

Figure 2A:
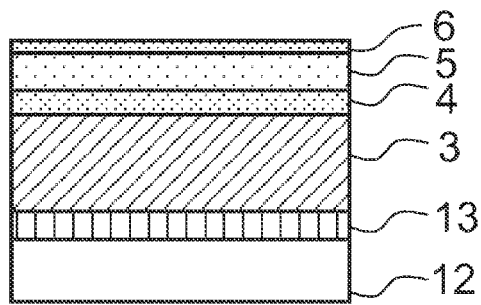
FIGS. 2A to 2G are views for illustrating a method of manufacturing a nitride semiconductor device according to Example 2 of the present invention.

As shown in FIG. 2A, first, five semiconductor layers are epitaxially grown sequentially over an n-type GaN substrate 12 by an MOVPE method. The five layers are: an n-type GaN buffer layer 13 having a Si concentration of $2\times10^{18}$ cm$^{-3}$ and a thickness of 2,000 nm; an n-type collector layer 3 including n-type GaN and having a Si concentration of 1 to $2\times10^{-3}$ cm$^{-3}$ and a thickness of 10,000 nm; a first p-type base layer 4 including p-type GaN and having a Mg concentration of $2\times10^{19}$ cm$^{-3}$ and a thickness of 100 nm; a second p-type base layer 5 including p-type GaN and having a thickness of 600 nm and a concentration gradient such that Mg concentration gradually decreases from $5\times10^{18}$ cm$^{-3}$ to $5\times10^{17}$ cm$^{-3}$ from a lower portion to an upper portion of the layer; and a third p-type base layer 6 including p-type GaN and having a Mg concentration of $2\times10^{20}$ cm$^{-3}$ and a thickness of 30 nm. After the epitaxial growth of the layers, a Mg activation anneal (N$_2$ atmosphere, 600° C., 30 minutes) for the first to third p-type base layers 4, 5, and 6 is conducted using a heat treatment furnace.

Figure 2E:
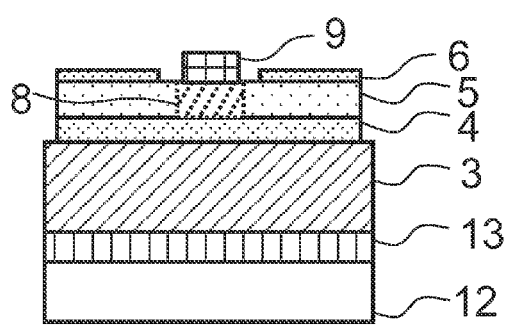
Figure 2B:
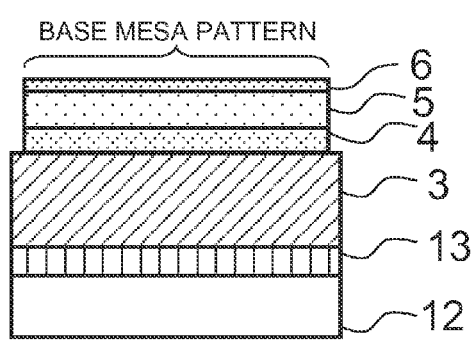

As shown in FIG. 2B, a base mesa pattern of SiO$_2$ is formed, followed by dry etching in chlorine gas while using the SiO$_2$ base mesa pattern as a mask so as to etch the first to third p-type base layers 4, 5, and 6, thereby forming a base mesa pattern.

Figure 2F:
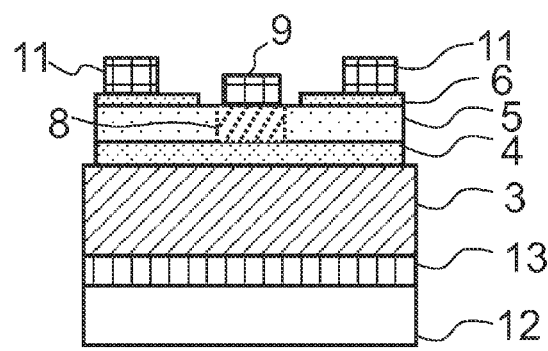
Figure 2C:
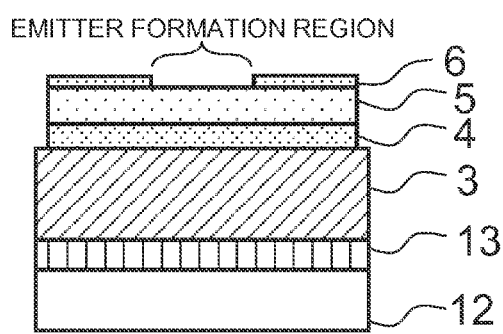

As shown in FIG. 2C, a photoresist pattern with an opening corresponding to an emitter formation region inside the base mesa pattern including the first to third p-type base layers 4, 5, and 6 is formed, and the third p-type base layer 6 exposed in the opening area is dry etched in the same manner as above, to expose the second p-type base layer 5 beneath it.

Figure 2G:
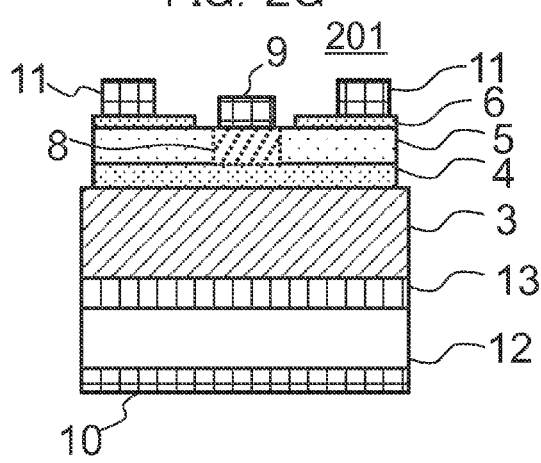
Figure 2D:
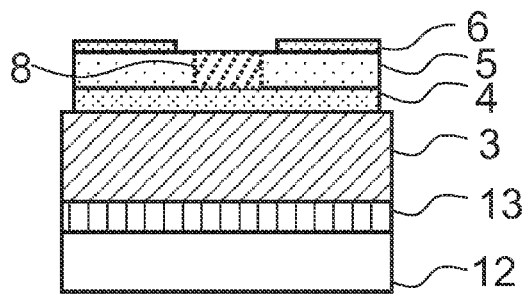

As shown in FIG. 2D, a SiN through film in a thickness of 20 nm is formed to coat the whole surface of the substrate. Then, a photoresist pattern with an opening corresponding to a region on the inner side than the region where the second p-type base layer 5 is exposed is formed, followed by Si ion implantation from the face side of the substrate, to implant Si ions into the second p-type base layer 5 in the opening area. The implantation conditions were two acceleration voltages of 60 keV and 160 keV and an implantation amount of $3\times10^{15}$ cm$^{-2}$ in total. Unrequired photoresist and SiN film are removed by a wet process, and then a SiN protective film in a thickness of 50 nm is formed to coat the whole substrate surface. Thereafter, an activation anneal treatment is conducted in a N$_2$ atmosphere at 1,100° C. for 10 minutes, whereby an n-type emitter region 8 is formed in the second p-type base layer 5. Subsequently, unrequired Si protective film is removed.

As shown in FIG. 2E, an emitter electrode opening pattern including a multilayer resist with an opening corresponding to a desired region inside the n-type emitter region 8 is formed by a known photolithography technique, and then a Ti/Al stacked film is formed to coat the whole substrate surface by an electron beam evaporation method. Thereafter, unrequired metal film and photoresist are removed by a lift-off method, whereby an emitter electrode pattern including the Ti/Al stacked film is formed. Subsequently, the substrate thus formed with the electrode pattern is heat treated in a N$_2$ atmosphere at 500° C. for 10 minutes, whereby an emitter electrode 9 exhibiting good ohmic characteristics to each of the layers is formed.

As shown in FIG. 2F, a base electrode opening pattern including a multilayer resist with an opening corresponding to a desired region on the third p-type base layer 6 is formed by a known photolithography technique, and then a Pd/Ti/Au stacked film is formed to coat the whole substrate surface by an electron beam evaporation method. Thereafter, unrequired metal film and photoresist are removed by a lift-off method, whereby a base electrode 11 including the Pd/Ti/Au stacked film is formed.

As shown in FIG. 2G, a Ti/Al stacked film is formed to coat the whole back-side surface of the n-type GaN substrate 12 by an electron beam evaporation method, and then a heat treatment is again conducted in a N$_2$ atmosphere at 500° C. for 10 minutes, whereby a collector electrode 10 exhibiting good ohmic characteristics to the back side of the n-type GaN substrate 12 is formed. By this, the npn-type homojunction bipolar transistor 201 fabricated on the n-type GaN substrate as shown in FIG. 1, which is one embodiment of the nitride semiconductor device of the present invention is completed.

When device characteristics of the bipolar transistor fabricated in this Example were evaluated, a DC current amplification factor $h_{FE}$ as high as 160 at maximum was obtained. It is inferred that a large reduction of defects and dislocations inside the epitaxial layers owing to the use of the n-type GaN substrate, an increase in effective donor density inside the n-type emitter region due to an increase in the Si implantation amount in the n-type emitter region, and the like contributed to the increase in $h_{FE}$.

In addition, since the collector electrode was formed in a wide area on the back side of the n-type GaN substrate, the current path was formed to be broad in the vertical direction, and this effected an increase in collector current $I_C$ by not less than two orders of magnitude, although the device is equivalent in emitter area to the device in Example 1. Furthermore, a high withstanding voltage characteristic of 300 V at maximum was obtained, reflecting the Si concentration and film thickness of the n-type collector layer.

Besides, in this Example, the second p-type base layer 5 was set to be a layer having a concentration gradient such that Mg concentration gradually decreases from $5 \times 10^{18}$ cm$^{-3}$ to $5 \times 10^{17}$ cm$^{-3}$ from a lower portion to an upper portion of the layer. With this structure, also, normal transistor operations could be confirmed. Thus, it is seen that the second p-type base layer (second p-type nitride semiconductor layer) may not necessarily have a constant Mg concentration, and may have an impurity concentration gradient from a lower portion to an upper portion thereof.

In view of this, even where an npn-type bipolar transistor is fabricated on an n-type GaN substrate by use of the structure relevant to the present invention, the object of the present invention can be achieved.

In addition, in this Example and in Example 1 above, a horizontal shortest distance 31 from an end portion of the n-type emitter region formed by Si ion implantation to an end portion of the base electrode is 10 μm, which is conspicuously long as compared with a vertical distance 32 (630 nm) from the lower surface of the base electrode to the upper surface of the first p-type base layer 4.

If the horizontal distance 31 from the end portion of the emitter region to the end portion of the base electrode is set shorter than the vertical distance 32 from the lower surface of the base electrode to the first p-type base layer, there would result an increase in a horizontal current component by way of the second p-type base layer in passage of current between the base and the emitter. This horizontal current component is a current component that does not contribute to conductivity modulation necessary for transistor operations.

In order to obtain favorable transistor operations in the structure in this Example, it is ideal to adopt a biasing with a current (base current $I_B$) between the base and the emitter by way of the first p-type base layer that is the lowest of the p-type nitride semiconductor layers in resistivity.

Therefore, the horizontal distance 31 from the end portion of the emitter region to the end portion of the base electrode is set as long as possible, at least longer than the vertical distance 32 from the lower surface of the base electrode to the first p-type base layer, so as to increase the horizontal resistance component by way of the second p-type base layer. This structure ensures that the horizontal current component through the second p-type base layer is reduced, and a current component through the first p-type base layer (which is the lowest in resistance) constitutes a main part of the current.

Accordingly, in a dimensional layout necessary for carrying out the present invention, it is important to ensure at least that the horizontal shortest distance 31 from an end portion of the n-type emitter region to an end portion of the base electrode is greater than the vertical distance 32 from the lower surface of the base electrode to the upper surface of the first p-type base layer.

In addition, other methods for enhancing the resistance of the second p-type base layer located between the base electrode and the n-type emitter region include a method in which the portion ranging from the periphery of the n-type emitter region to the base electrode is removed by dry etching in the manner of leaving the first p-type base layer, and a method in which other element is implanted into the portion ranging from the periphery of the n-type emitter region to the base electrode so as to raise the resistance of the portion. When one of these methods is used, it is possible to shorten the distance between the base electrode and the n-type emitter region, but, on the other hand, the pattern layout and process conditions would be complicated.

While an example in which a through film including SiN is formed prior to Si ion implantation has been described in this Example, the through film may be omitted as in Example 1 above.

In this Example and Example 1 above, description has been made of an example in which a protective film including SiN is formed before the activation anneal for the ion-implanted region. However, the protective film is not specifically restricted to the SiN protective film. Naturally, an insulating film that is durable to the activation annealing temperature and that can be easily removed by a wet treatment with HF or the like can be used, such as insulating films of SiO$_2$, SiON, etc.

As has been described above, when a nitride semiconductor epitaxial substrate constructed by epitaxially growing an n-type GaN buffer layer having a Si concentration of $2 \times 10^{18}$ cm$^{-3}$ and a thickness of 2,000 nm and an n-type GaN layer having a Si concentration of 1 to $2 \times 10^{16}$ cm$^{-3}$ and a thickness of 10,000 nm over an n-type GaN substrate is prepared, it is possible to configure a p-type nitride semiconductor layer of a three-layer structure with different p-type impurity concentrations in a desired region on the substrate, and, by use of a Si ion implantation technique, to form a bipolar transistor comparatively easily.

Example 3

Figure 10:
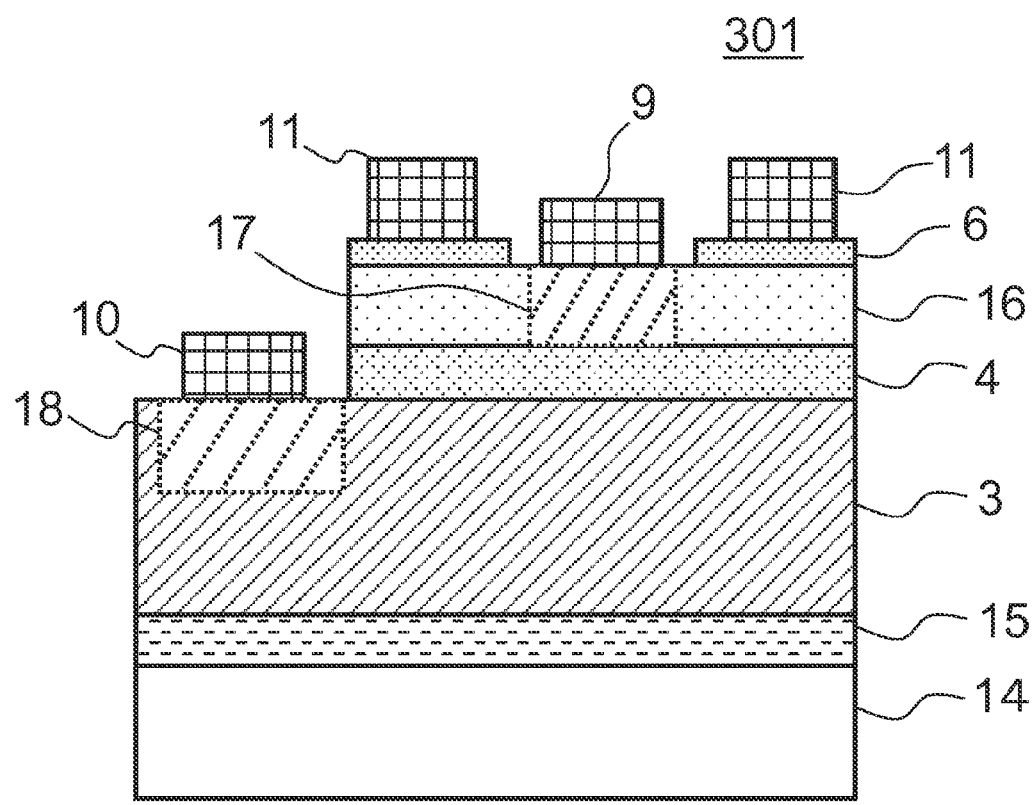
FIG. 10 is a sectional view of an npn-type heterojunction bipolar transistor fabricated on a SiC substrate which is a nitride semiconductor device according to Example 3 of the present invention.

Now, an embodiment of a nitride semiconductor device as Example 3 of the present invention will be described below. FIG. 10 is a sectional view of a nitride semiconductor device according to this Example.

As shown in FIG. 10, a nitride semiconductor device 301 according to the present invention is an npn-type heterojunction bipolar transistor fabricated on a SiC substrate. Specifically, a 2,000 nm-thick superlattice buffer layer 15 (a superlattice layer which relaxes a lattice misfit between SiC substrate and GaN) and an n-type collector layer 3 including n-type GaN and having a Si concentration of $5 \times 10^{16}$ cm$^{-3}$ and a thickness of 4,000 nm are provided over a SiC substrate 14. In a desired region over the n-type collector layer 3, there are provided three p-type base layers. The three p-type base layers are: a first p-type base layer 4 including p-type GaN and having a Mg concentration of $2 \times 10^{19}$ cm$^{-3}$ and a thickness of 200 nm; a second p-type base layer 16 including p-type AlGaN (Al content: 8%) and having a thickness of 300 nm and a Mg concentration of $1\times10^{19}$ cm$^{-3}$; and a third p-type base layer 6 formed in a desired region on the second p-type base layer 16, including p-type GaN and having a Mg concentration of $2\times10^{20}$ cm$^{-3}$ and a thickness of 10 nm.

In a desired region inside the second p-type base layer 16 (a region where the third p-type base layer 6 is not provided on the second p-type base layer 16), there is provided an n-type emitter region 17 including n-type AlGaN (Al content: 8%) formed by Si ion implantation.

The Si ion implantation conditions here are an acceleration voltage of 160 keV and an implantation amount of $2\times10^{15}$ cm$^{-2}$. Note that in this Example, simultaneously with the formation of the n-type emitter region 17, Si ions are implanted also into a desired region of the n-type collector layer 3 where a collector electrode is to be formed, whereby a low-resistance n-type sub-collector region 18 is provided.

This ensures that the ohmic property between the collector electrode and the n-type collector layer is enhanced. In addition, since the n-type sub-collector region 18 is formed to range into the vicinity of the base mesa, a lowering effect on collector resistance is also obtained.

An emitter electrode 9 is provided in a desired region on the n-type emitter region 17; a base electrode 11 is provided in a desired region on the third p-type base layer 6; and a collector electrode 10 is provided in a desired region on the n-type sub-collector region 18.

In the structure according to this Example, the semiconductor material of the n-type emitter region is AlGaN (Al content: 8%) and that of the first p-type base layer inclusive of an intrinsic base region is GaN. Therefore, the emitter-base junction is an AlGaN—GaN heterojunction. This enables freedom from the problems on a device design basis that are peculiar to homojunction bipolar transistors. Accordingly, a free device designing can be made.

The device fabricated in this Example showed good characteristics represented by a $h_{FE}$ of 56 at maximum and an offset voltage of not higher than 0.3 V. In addition, owing to an effect of the n-type sub-collector region provided by Si ion implantation, the value of collector current $I_C$ obtained here was about one order of magnitude greater than that shown in Example 1.

Example 4

Figure 11:
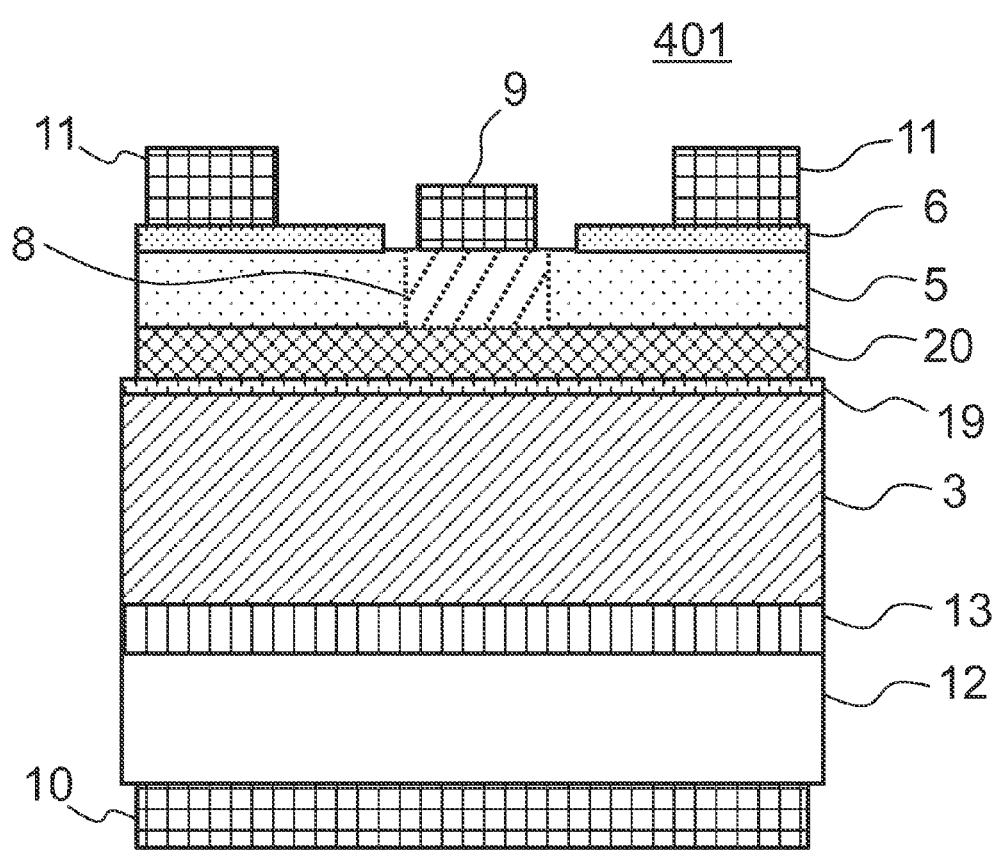
FIG. 11 is a sectional view of an npn-type heterojunction bipolar transistor fabricated on an n-type GaN substrate which is a nitride semiconductor device according to Example 4 of the present invention.

Now, an embodiment of a nitride semiconductor device as Example 4 of the present invention will be described below. As shown in FIG. 11, a nitride semiconductor device 401 according to this Example is an npn-type heterojunction bipolar transistor fabricated on an n-type GaN substrate. Specifically, an n-type GaN buffer layer 13 having a Si concentration of $2\times10^{18}$ cm$^{-3}$ and a thickness of 2,000 nm, an n-type collector layer 3 including n-type GaN and having a Si concentration of $1\times10^{17}$ cm$^{-3}$ and a thickness of 5,000 nm, and an n-type InGaN graded layer 19 having a thickness of 30 nm and a Si concentration of $1\times10^{16}$ cm$^{-3}$ together with a graded composition such that In content is gradually increased from 0% to 10% from a lower portion to an upper portion of the layer, are sequentially provided over an n-type GaN substrate 12. In a desired region over the n-type InGaN graded layer 19, there are provided three p-type base layers. The three p-type base layers are: a first p-type base layer 20 including p-type InGaN and having a Mg concentration of $4\times10^{19}$ cm$^{-3}$ and a thickness of 80 nm; a second p-type base layer 5 including p-type GaN and having a thickness of 400 nm and a Mg concentration of $5\times10^{17}$ cm$^{-3}$; and a third p-type base layer 6 provided in a desired region on the second p-type base layer 5, including of p-type GaN and having a Mg concentration of $2\times10^{20}$ cm$^{-3}$ and a thickness of 20 nm.

In this Example, the first p-type base layer 20 includes InGaN. Taking this into account, the temperature of the Mg activation anneal after epitaxial growth is set at 750° C. The annealing is carried out for 30 minutes.

In a desired region inside the second p-type base layer 5 (a region where the third p-type base layer 6 is not provided on the second p-type base layer 5), there is provided an n-type emitter region 8 including n-type GaN formed by Si ion implantation. The Si ion implantation conditions in this instance are an acceleration voltage of 130 keV and an implantation amount of $1\times10^{15}$ cm$^{-2}$.

An emitter electrode 9 is provided in a desired region on the n-type emitter region 8; a base electrode 11 is provided in a desired region on the third p-type base layer 6; and a collector electrode 10 is provided on the back side of the n-type GaN substrate.

In the structure according to this Example, the semiconductor material of the n-type emitter region is GaN and that of the first p-type base layer constituting an intrinsic base region is InGaN. Therefore, the emitter-base junction is a GaN—InGaN heterojunction.

As for characteristics of the device fabricated in this Example, an $h_{FE}$ of 300 at maximum was obtained. Further, in $I_C$-$V_{CE}$ characteristics, a small signal current amplification factor $h_{fe}$ of 370 at maximum was obtained. This naturally shows that according to this Example in which the structure of epitaxially grown layers is somewhat complicated, also, the object of the present invention can be achieved by adopting the structure including the n-type emitter region formed by Si ion implantation according to an aspect of the present invention.

In the above Examples, a homojunction type bipolar transistor in which GaN is used for all of first to third p-type base layers has been described as an example. Naturally, however, all the three base layers may also be formed of an AlGaN layer, InAlGaN layer, or InGaN layer of arbitrary Al and In contents, inasmuch as good crystal quality can be obtained thereby.

Besides, as exemplary heterojunction type bipolar transistors, there have been described an example in which GaN is used for a first p-type base layer and AlGaN is used for a second p-type base layer formed therein with an n-type emitter region and an example in which InGaN is used for a first p-type base layer and GaN is used for a second p-type base layer. Other than these, there may also be adopted a stacked structure formed using semiconductors with arbitrary Al and In contents such that the band gap of the first p-type base layer is greater than the band gap of the second p-type base layer. Examples of such a stacked structure include a stacked structure in which InGaN is used for the first p-type base layer and AlGaN is used for the second, and a stacked structure in which GaN is used for the first p-type base layer and InAlGaN is used for the second.

In the above Examples, it has been described that a p-type impurity and an n-type impurity are mixedly present in the n-type emitter region formed by ion implantation. In this case, in order to obtain n-type conductivity in the n-type emitter region, it suffices that the n-type emitter region is formed so as to ensure at least that the n-type impurity concentration is greater than the p-type impurity concentration.

In the above Examples, examples wherein a sapphire substrate, an n-type GaN substrate, and a SiC substrate are respectively used as the substrate have been described. Other than these, naturally, a Si substrate may also be used. When an epitaxial substrate configured by epitaxially growing an n-type nitride semiconductor layer on such a substrate is prepared, a bipolar transistor can be formed in a desired region on the substrate comparatively easily.

The position in which to form a collector electrode is on the face side of the substrate in the case of fabricating the bipolar transistor on the sapphire substrate, SiC substrate, or Si substrate. On the other hand, in the case of using the n-type GaN substrate, the collector electrode may be formed on the back side of the substrate, as in the above Examples, or may naturally be formed on the face side.

Besides, examples wherein Mg (magnesium) and Si (silicon) are applied as a p-type impurity and an n-type impurity have been described in the above Examples. However, the impurities to be used are not particularly limited, so long as the respective conductivity types desired can be obtained using the impurities.

In addition, examples wherein the temperature of the Mg activation anneal conducted after crystal growth is 600° C. and 750° C., respectively, have been described in the above Examples. Since the optimum annealing temperature differs depending on the semiconductor materials used, the temperature is preferably set in the range of not lower than 500° C. and not higher than 900° C., and desirably in the range of 600° C. to 800° C.

An example wherein the temperature of the carrier activation anneal conducted for the n-type emitter region after ion implantation is 1,100° C. has been described in the above Example. In this case, a lower limit for the temperature is 1,050° C.; when an annealing treatment is conducted at or above this temperature, the ion-implanted region can be activated. In addition, an upper limit for the annealing temperature, which also depends on the thermal resistance of the protective film formed before the anneal, is preferably 1,200° C. in the case where a SiN film is used.

What is claimed is:

1. A nitride semiconductor device comprising:
a substrate;
a first n-type nitride semiconductor layer formed over the substrate;
a first p-type nitride semiconductor layer having a first p-type impurity concentration, the first p-type nitride semiconductor layer formed in a region of a base mesa pattern over the first n-type nitride semiconductor layer;
a second p-type nitride semiconductor layer having a second p-type impurity concentration, the second p-type nitride semiconductor layer formed over an entire area of the first p-type nitride semiconductor layer;
a third p-type nitride semiconductor layer having a third p-type impurity concentration, the third p-type nitride semiconductor layer formed in a partial region over the second p-type nitride semiconductor layer;
a region including a second n-type nitride semiconductor formed inside a partial region of the second p-type nitride semiconductor layer by ion implantation of an n-type impurity;
a first electrode put in ohmic connection to the first n-type nitride semiconductor layer;
a second electrode put in ohmic connection to the third p-type nitride semiconductor layer; and
a third electrode put in ohmic connection to the second n-type nitride semiconductor,
wherein the first p-type impurity concentration concerning impurity addition to the first p-type nitride semiconductor layer is higher than the second p-type impurity concentration concerning impurity addition to the second p-type nitride semiconductor layer, and the third p-type impurity concentration concerning impurity addition to the third p-type nitride semiconductor layer is higher than the second p-type impurity concentration concerning impurity addition to the second p-type nitride semiconductor layer.

2. The nitride semiconductor device according to claim 1, wherein a first electrode put in ohmic connection to a back side of the substrate is formed in place of the first electrode put in ohmic connection to the first n-type nitride semiconductor layer.

3. The nitride semiconductor device according to claim 1, wherein the region including the second n-type nitride semiconductor formed in the partial region of the second p-type nitride semiconductor layer contains added thereto both a p-type impurity and an n-type impurity.

4. The nitride semiconductor device according to claim 2, wherein the region including the second n-type nitride semiconductor formed inside the partial region of the second p-type nitride semiconductor layer contains added thereto both a p-type impurity and an n-type impurity.

5. The nitride semiconductor device according to claim 1, wherein the second p-type impurity concentration in the second p-type nitride semiconductor layer has a concentration gradient along a direction from a lower portion to an upper portion of the layer.

6. The nitride semiconductor device according to claim 2, wherein the second p-type impurity concentration in the second p-type nitride semiconductor layer has a concentration gradient along a direction from a lower portion to an upper portion of the layer.

7. The nitride semiconductor device according to claim 1, wherein a minimum distance from an end portion of the region including the second n-type nitride semiconductor that is formed inside the partial region of the second p-type nitride semiconductor layer to the second electrode is at least longer than a distance represented by a vertical thickness from the second electrode to the first p-type nitride semiconductor layer.

8. The nitride semiconductor device according to claim 2, wherein a minimum distance from an end portion of the region including the second n-type nitride semiconductor that is formed inside the partial region of the second p-type nitride semiconductor layer to the second electrode is at least longer than a distance represented by a vertical thickness from the second electrode to the first p-type nitride semiconductor layer.

9. The nitride semiconductor device according to claim 1, wherein the substrate is a substrate selected from the group consisting of an n-type GaN substrate, a sapphire substrate, a SiC substrate, and a Si substrate.

10. The nitride semiconductor device according to claim 2, wherein the substrate is an n-type GaN substrate.

11. The nitride semiconductor device according to claim 1, wherein every one of the first to third p-type nitride semiconductor layer includes a GaN layer or includes a AlGaN layer, a InAlGaN layer, or a InGaN layer that has arbitrary Al and In contents.

12. The nitride semiconductor device according to claim 11, wherein the nitride semiconductor device is an npn-type homojunction bipolar transistor.

13. The nitride semiconductor device according to claim 1, adopting one configuration selected from the group consisting of a configuration in which GaN is used for the first p-type nitride semiconductor layer and AlGaN is used for the second p-type nitride semiconductor layer, a configuration in which InGaN is used for the first p-type nitride semiconductor layer and GaN is used for the second p-type nitride semiconductor layer, a configuration in which InGaN is used for the first p-type nitride semiconductor layer and AlGaN is used for the second p-type nitride semiconductor layer, a configuration in which GaN is used for the first p-type nitride semiconductor layer and InAlGaN is used for the second p-type nitride semiconductor layer, and a configuration in which use is made of semiconductor layers having arbitrary Al and In contents such that a band gap of the second p-type semiconductor layer is greater than a band gap of the first p-type nitride semiconductor layer.

14. The nitride semiconductor device according to claim 13, wherein the nitride semiconductor device is an npn-type heterojunction bipolar transistor.

15. The nitride semiconductor device according to claim 1, wherein the p-type impurity contained in the first to third p-type nitride semiconductor layers is Mg (magnesium), and the n-type impurity contained in the region including the first n-type nitride semiconductor layer and the second n-type nitride semiconductor is Si (silicon).

16. An epitaxial substrate formed with a nitride semiconductor device, the nitride semiconductor device comprising:
an n-type nitride semiconductor substrate;
a first n-type nitride semiconductor layer formed over the n-type nitride semiconductor substrate;
a first p-type nitride semiconductor layer having a first p-type impurity concentration and formed in a region of a base mesa pattern over the first n-type nitride semiconductor layer;
a second p-type nitride semiconductor layer having a second p-type impurity concentration and formed over an entire area of the first p-type nitride semiconductor layer;
a third p-type nitride semiconductor layer having a third p-type impurity concentration and formed in a partial region over the second p-type nitride semiconductor layer;
a region including a second n-type nitride semiconductor that is formed inside a partial region of the second p-type nitride semiconductor layer by ion implantation of an n-type impurity;
a first electrode formed on a back side of the substrate;
a second electrode formed on the third p-type nitride semiconductor layer; and
a third electrode formed on the second n-type nitride semiconductor,
wherein the first p-type impurity concentration is higher than the second p-type impurity concentration, and the third p-type impurity concentration is higher than the second p-type impurity concentration.

* * * * *